(12) United States Patent
Steinwandel et al.

(10) Patent No.: US 10,882,627 B2
(45) Date of Patent: Jan. 5, 2021

(54) AIRCRAFT DRIVE DEVICE AND AIRCRAFT PROVIDED WITH A DRIVE DEVICE

(71) Applicant: Airbus Defence and Space GmbH, Taufkirchen (DE)

(72) Inventors: Jürgen Steinwandel, Uhldingen-Mühlhofen (DE); Michael Hofmann, Neubiberg (DE); Michael Judas, Munich (DE)

(73) Assignee: AIRBUS DEFENCE AND SPACE GMBH, Taufkirchen (DE)

( * ) Notice: Subject to any disclaimer, the term of this patent is extended or adjusted under 35 U.S.C. 154(b) by 355 days.

(21) Appl. No.: 15/850,350

(22) Filed: Dec. 21, 2017

(65) Prior Publication Data
US 2018/0170565 A1 Jun. 21, 2018

(30) Foreign Application Priority Data
Dec. 21, 2016 (EP) ..................................... 16205978

(51) Int. Cl.
*B64D 27/24* (2006.01)
*B64D 45/02* (2006.01)
(Continued)

(52) U.S. Cl.
CPC .............. *B64D 27/24* (2013.01); *B64D 35/00* (2013.01); *B64D 45/02* (2013.01); *H01T 4/08* (2013.01);
(Continued)

(58) Field of Classification Search
CPC ........ Y02T 50/62; B64D 27/24; B64D 45/02; B64D 29/00; B64D 35/00; H05K 9/0047; H05K 11/26; H01T 7/00
(Continued)

(56) References Cited

U.S. PATENT DOCUMENTS 4,625,256 A * 11/1986 Scuka ..................... F03D 80/30
361/117
8,313,295 B2 * 11/2012 Olsen ..................... F03D 80/30
416/1
(Continued)

FOREIGN PATENT DOCUMENTS

DE 10 2004 00448 6/2006
DE 10 2005 006 511 8/2006
(Continued)

OTHER PUBLICATIONS

Search Report for EP16205978.6, dated Jun. 23, 2017, 7 pages.

*Primary Examiner* — Eduardo Colon Santana
*Assistant Examiner* — Devon A Joseph
(74) *Attorney, Agent, or Firm* — Nixon & Vanderhye P.C.

(57) ABSTRACT

An aircraft drive device (10) for creating propulsion and/or lift of an aircraft, the drive device comprising a rotating shaft (12), a rotating shaft bearing (14, 16), a rotating shaft drive machine (18) for rotationally driving the rotating shaft (12), and a housing (20), wherein the rotating shaft bearing (14,16) and the rotating shaft drive device (18) are arranged in an interior of the housing (44) and the rotating shaft (12) protrudes to the outside of the housing (20) through a housing opening (42) of the housing (20), wherein in the region of the housing opening (42) an overvoltage arrester device (52) is arranged which is designed for diverting an overvoltage present at the rotating shaft (12).

19 Claims, 2 Drawing Sheets

(51) Int. Cl.
    *H05K 9/00* (2006.01)
    *H02K 11/26* (2016.01)
    *B64D 35/00* (2006.01)
    *H02K 7/08* (2006.01)
    *H01T 7/00* (2006.01)
    *H01T 4/10* (2006.01)
    *H01T 4/08* (2006.01)
    *B64D 29/00* (2006.01)
    *B64C 39/02* (2006.01)

(52) U.S. Cl.
    CPC ............ *H01T 4/10* (2013.01); *H01T 7/00* (2013.01); *H02K 7/083* (2013.01); *H02K 11/26* (2016.01); *H05K 9/0047* (2013.01); *B64C 39/024* (2013.01); *B64C 2201/042* (2013.01); *B64C 2201/108* (2013.01); *B64C 2201/165* (2013.01); *B64D 29/00* (2013.01); *Y02T 50/60* (2013.01)

(58) Field of Classification Search
    USPC .......................................................... 318/33
    See application file for complete search history.

(56) References Cited

U.S. PATENT DOCUMENTS

| | | | | |
|---|---|---|---|---|
| 8,723,694 B1* | 5/2014 | Finley | .................... | B64D 45/00 340/970 |
| 9,181,927 B2* | 11/2015 | Lewke | .................... | F03D 80/00 |
| 10,316,822 B2* | 6/2019 | Hoffmann | ............. | F03D 7/0244 |
| 10,371,066 B2* | 8/2019 | Steinwandel | ........... | F02D 29/02 |
| 2006/0011780 A1* | 1/2006 | Brand | .................... | B64D 35/04 244/60 |
| 2007/0114797 A1* | 5/2007 | Krug | ...................... | H02G 13/00 290/44 |
| 2009/0102409 A1* | 4/2009 | Okita | .................... | G05B 19/404 318/561 |
| 2010/0072318 A1* | 3/2010 | Westenberger | ........ | B64D 37/04 244/54 |
| 2010/0133817 A1* | 6/2010 | Kinzie | .................... | F03D 7/043 290/44 |
| 2010/0133821 A1* | 6/2010 | Scholte-Wassink | ........ | F03D 7/0224 290/44 |
| 2011/0004364 A1* | 1/2011 | Sawada | ................. | B60K 6/445 701/22 |
| 2011/0108663 A1* | 5/2011 | Westenberger | ........ | B64D 27/02 244/60 |
| 2011/0284688 A1 | 11/2011 | Chuc et al. | | |
| 2016/0281687 A1* | 9/2016 | Sogaard | ................ | F03D 80/30 |
| 2017/0214232 A1* | 7/2017 | Aspas Puertolas | .... | B64D 45/02 |

FOREIGN PATENT DOCUMENTS

| | | |
|---|---|---|
| DE | 10 2006 046 002 | 4/2008 |
| DE | 10 2006 056 356 | 6/2008 |
| DE | 10 2010 021 024 | 11/2011 |
| DE | 10 2011 112 518 | 11/2012 |
| DE | 10 2013 101 602 | 9/2014 |
| DE | 10 2013 109 392 | 3/2015 |
| WO | WO 84/01673 | 4/1984 |

* cited by examiner

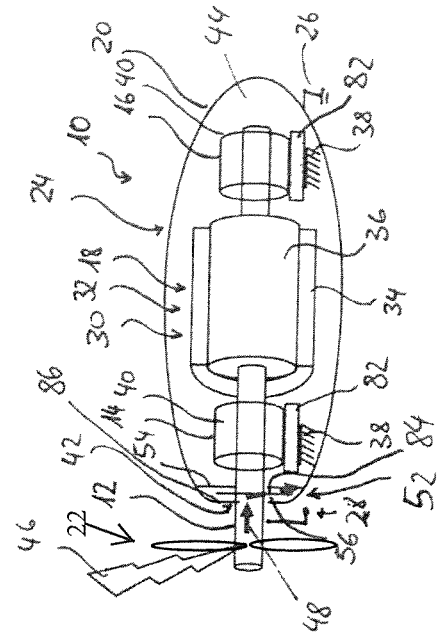
Fig. 1
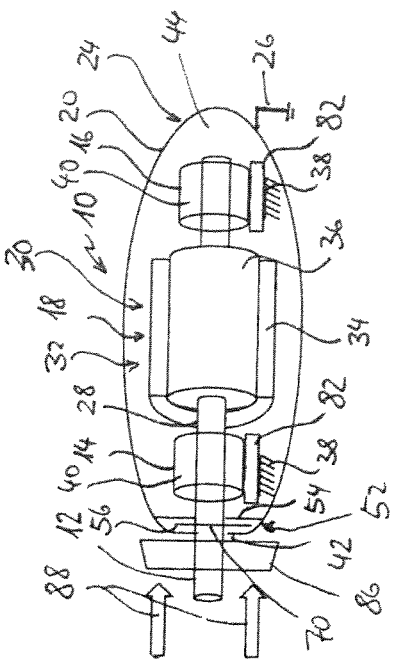
Fig. 2
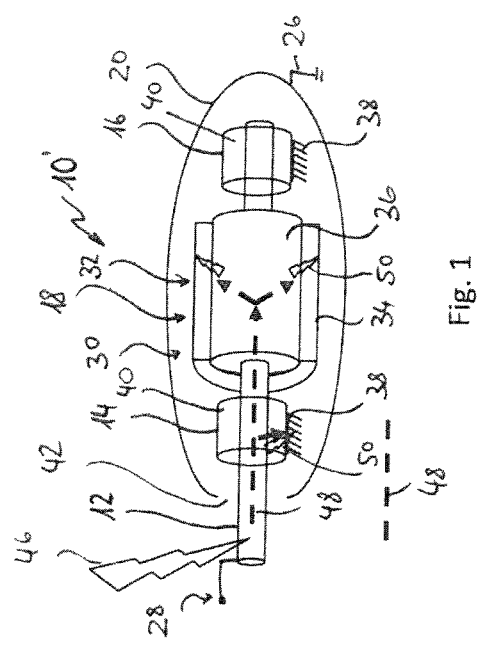
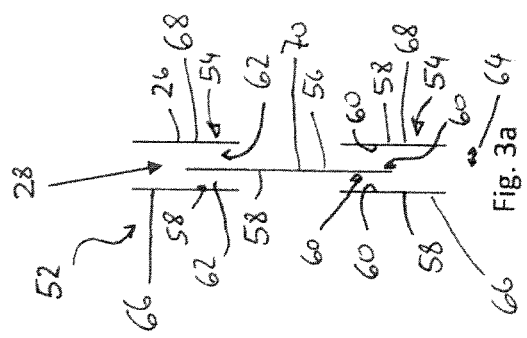
Fig. 3a
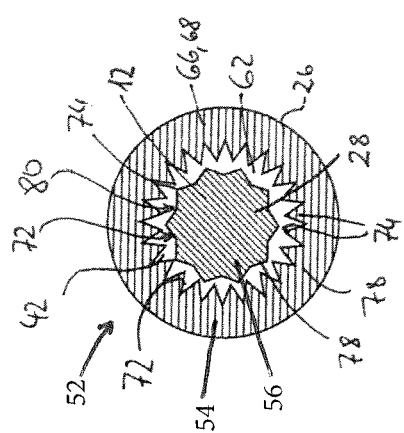
Fig. 3b
Fig. 4

AIRCRAFT DRIVE DEVICE AND AIRCRAFT PROVIDED WITH A DRIVE DEVICE

RELATED APPLICATION

This application claims priority to European Patent Application 16205978.6 filed Dec. 21, 2016, the entirety of which is incorporated by reference.

BACKGROUND OF THE INVENTION

The invention relates to an aircraft drive device for creating propulsion and/or lift of an aircraft, the drive device having a rotating shaft protruding from a housing. The invention also relates to an aircraft provided with the drive device.

Examples of such aircraft drive devices are disclosed in DE 10 2005 006 511 A1, DE 10 2013 109 392 A1 or DE 10 2010 021 024 B1.

Currently, aircraft equipped with electrically driven propellers are no longer the subject of theoretical considerations, but rather are at the beginning of concrete developments for different use cases, see the above-mentioned documents and also DE 10 2013 101 602 A1 and DE 10 2006 056 356 A1.

SUMMARY OF THE INVENTION

The invention may be embodied to improve an aircraft drive device for creating propulsion and/or lift of an aircraft and having a rotating shaft protruding from a housing with regard to operational safety at various weather conditions, with little constructional effort.

The invention, in one embodiment, is an aircraft comprising a drive device of the type disclosed herein.

According to one aspect, the invention provides an aircraft drive device for creating propulsion and/or lift of an aircraft, the drive device comprising a rotating shaft, a rotating shaft bearing, a rotating shaft drive machine for rotationally driving said rotating shaft, and a housing, such as a nacelle, wherein the rotating shaft bearing and the rotating shaft drive machine are arranged in the interior of the housing and the rotating shaft protrudes to the outside of the housing through a housing opening of the housing, wherein in the region of the housing opening an overvoltage arrester device is arranged which is designed for diverting an overvoltage present at the rotating shaft.

At least a region of the rotating shaft may be at an electrical potential of the rotating shaft and at least a region of the housing is at an electrical potential of the housing and that an overvoltage arrester device is designed for diverting an overvoltage from the rotating shaft potential to the housing potential. Alternatively, the overvoltage arrester device can also divert the overvoltage to other potentials on the aircraft, such as to ground or to the potential of an electrical discharge and distribution device.

The rotating shaft drive machine may be an electric machine, such as an electric motor having a rotor and a stator.

The aircraft drive device may comprise an electrically driven propeller.

The propeller may be arranged on the part of the rotating shaft protruding from the housing.

A first rotating shaft bearing and a second rotating shaft bearing may be provided.

The housing may be designed for providing lightening protection for the rotating shaft drive machine itself.

The housing may create a Faraday cage.

The overvoltage arrester device may comprise a stationary electrode element being at a potential to which the diversion shall be made, such as the housing potential or the ground, and a rotatable electrode element being at a rotating shaft potential, wherein for a contactless voltage transfer of over-voltages, said electrode elements are spaced by a gap.

At least one of the electrode elements may be ring-shaped.

It is preferred that at least one of the electrode elements comprises a first ring and a second ring between which the other electrode element is received.

The electrode elements may comprise substantially parallel opposing electrode surfaces between which said gap is formed.

At least one of the electrode elements may comprise an electric arc ignition element for igniting a plasma channel for the purpose of transferring the overvoltage.

At least one of the electrode elements may be provided with a tip formed of a conductive material.

At least one of the electrode elements may be provided with a coating in which spikes formed of conducting particles and/or polarizing particles are provided.

The gap may represent the smallest distance between the rotating shaft potential and the housing potential. The gap may have a gap distance in the range of 0.1 μm to 10 mm, preferably in the range of 0.01 mm to 5 mm.

The rotating shaft bearing may comprise a stationary bearing element and a rotatable bearing element and an electrical insulation for electrically insulating said stationary bearing element from said rotatable bearing element.

At least a region of the rotating shaft and/or the housing may be provided with a lightening protection coating. The lightening protection coating may comprise an electrically conductive layer or an electrically conductive grid. The lightening protection coating may be provided with electrically polarizable particles, electrically conductive spiked particles, or with electrically polarizable particles in a dielectric matrix.

The lightening protection coating may be a coating with electrically conductive spiked particles in a dielectric matrix or a coating with ignition elements for igniting an electric arc.

The overvoltage arrester device may comprise a wind deflector element for protecting the electric arc. The overvoltage arrester device may enable the diversion of an overvoltage between the rotating rotary shaft and a stationary part. The overvoltage arrester device may be designed in such a way that the diversion of the overvoltage takes place in a contactless manner by electric flashover and an electric arc. The overvoltage arrester device may have a field-boosting geometry so that the flashover preferably occurs at the intended location. The overvoltage arrester device may be provided with a field-boosting coating so that the flashover preferably occurs at the intended location.

The term "a/an" used in the present disclosure, particularly in the attached claims, is an indefinite article rather than a numeral and is intended to express that a single one of the items so designated is provided, but does not exclude that there may be present more than one of those items.

Some advantages and specific features of the disclosed embodiments of the invention will be described in more detail in the following.

The invention may be configured to provide lightening protection of electrically driven propellers.

The invention may be configured for an aircraft drive device equipped with an electrically driven propeller. This device can serve for creating propulsion and/or lift of the aircraft. The aircraft can for instance be an aircraft with lifting wings or also a rotary wing aircraft, such as a helicopter or quadcopter (also including designs with more or less than four rotors).

As apparent from prior art mentioned at the beginning, aircrafts, such as planes for example, having electrically driven propellers currently are not only the subject of theoretical considerations, but are at the beginning of concrete developments for various use cases.

A need in the aviation field is the protection of man and technical equipment against the effects of lightening strikes in the air. The risk of a lightening strike to an aircraft, such as a plane for example, cannot be avoided. For this reason, corresponding technical measures should be taken in order to avert damage to man and technical equipment when a lightening strike occurs.

Nowadays, aircrafts such as planes either comprise a metallic outer shell or a correspondingly incorporated conductive tissue made of copper for example, to create a Faraday cage so that the regions inside the cage are protected against the effects of a lightening strike. Corresponding technologies are also used in the aircraft according to said one aspect of the present invention.

An electric machine driving a propeller may be arranged in a surrounding housing to achieve an aerodynamically advantageous design of the drive unit. By means of this housing a lightening protection of the electric machine itself is achieved with the known measures.

However, in aircraft drive devices equipped with propellers, the position of the propeller in the open air and its connection to the rotating shaft, e.g. to the rotor of the electric machine, via the driving shaft, can be a concern with respect to lighting protection. Now, when a lightening strikes the propeller or the front part of the rotor shaft, even the rotor of the electric machine is raised to the electric potential of the lightening via the rotor shaft. As the distance between the rotor and the stator (connected to ground potential) should, as a matter of principle, be kept as small as possible to achieve a good magnetic coupling, the high voltage difference caused by the lightening results in flashovers and various damages, e.g. the destruction of the insulation of the winding, damage to magnetic material, damage to surfaces as a result of melting etc.

The mechanical bearings of the rotor shaft may be a concern because of flashovers occur as a result of the high voltage difference and the small distances. In this case, this leads for instance to a decomposition of the lubricant, to damages to the bearing races, to undesired welding. Further damages to downstream power electronics and to the on-board electrical system of the plane may result from the high voltage difference.

While it would be theoretically possible with a corresponding effort to isolate the bearings to shield the rotor stator constellation from high voltage differences, providing a technically reasonable system to protect the rotor-stator-constellation has proven difficult.

Embodiments of the invention make it possible to realize a maintenance-free protection of the electric machine and the subsequent components against the effects of a lightening strike to the rotor shaft without modifying the machine itself.

In embodiments of the invention, the entry region of the rotor shaft (or any other protruding rotating shaft) to the surrounding housing, an element is arranged which diverts the overvoltage to the housing potential already at this stage and thus protects the subsequent machine and further components.

As a further measure and in combination with the above measure, a lightening protection coating that embodies the invention is provided which in the case of a lightening strike absorbs a part of the lightening energy by ablation and thus reduces the remaining energy to be diverted. Examples of corresponding coatings are described for instance in DE 10 2006 046 002 A1 or DE 10 2011 112 518 A1. For further details concerning the coating and the production thereof, reference is explicitly made to these documents, which are incorporated herein by reference.

This contactless overvoltage diversion function is performed without the use of any wearing elements such as sliding contacts, by using two mutually associated conductive elements (herein referred to as electrode elements on account of their function), one thereof being connected to the rotor shaft in a rotatable and conductive manner and the other one being stationarily and conductively connected to the housing and to the surrounding structure to which the lightening current shall be diverted. The elements are positioned relative to each other in such a way that they almost touch each other, except for a small air gap, and thus constitute a preferred location of flashover of the lightening from the rotor shaft to the structure.

A further aspect of embodiments of the invention is the design of regions between which the flashover now occurs in such a manner that a boost of the field is caused, which causes an ignition of the electric arc preferably at this stage. Even a nanostructured variant for increasing the local field strength as mentioned in DE 10 2006 046 002 A1 is possible.

An implemented isolation of the rotor shaft bearings from the housing/structure supports a flashover at the intended location.

The mutually associated electrode elements are designed in such a way that an electric arc once burning, which has a very low voltage drop as a result of the plasma channel, is kept burning preferably until the complete decay of the lightening current in order to avoid repeated overvoltage loads on the electric machine as a result of an interruption and new ignition of the electric arc. This can be achieved for instance by shielding that region against the relative wind, in order to prevent the cooling of the electric arc. A wind deflector element for protecting the electric arc is provided. This can be a separately provided element or a part of an already existing element, e.g. on the housing.

In the case of a lightening strike, a Faraday cage created by the housing is extended over the electrical machine and up to the location of the mutually associated elements.

According to one aspect, the invention provides a device that enables the diversion of an overvoltage between a rotating rotary shaft and a stationary part.

According to a further aspect, the invention relates to a device performing this diversion of an overvoltage in a contactless manner by flashover and an electric arc.

According to a further aspect, the inventions relates to a device that is designed with a field-boosting geometry so that the flashover preferably occurs at the intended location.

According to a further aspect, the invention relates to a device provided with a field-boosting coating so that the flashover occurs at the intended location.

According to a further aspect, the invention relates to a device capable of completely bearing the current flowing between the rotating and the stationary parts during a lightening strike, at least for the duration thereof, without the device being damaged or at least without losing its function.

According to a further aspect, the invention relates to a combination with a coating or any other measure capable of absorbing a part of the incoming lightening energy, in order to reduce the energy to be diverted from the device compared to the original lightening energy.

According to a further aspect, the invention relates to an isolation of the rotating bearing behind this device which isolates the rotating part from the stationary part and thus makes it unlikely that a flashover occurs in the region of the bearing.

According to a further aspect, the invention relates to an arrangement of the rotating and the stationary elements of the assembly in such a way that an electric arc is kept burning as long as possible in order to avoid repeated loads due to an overvoltage.

Although the invention and the advantages thereof have been described on the basis of embodiments of electric propeller drives, the invention is not limited to these embodiments, but can be applied to any drive unit for aircrafts in which rotating shafts protrude from a protective housing to the outside and in which an increase of the electric potential of the rotating shaft might cause problems or damages inside the housing, particularly by a lightening strike. For example, the rotating shaft drive machine may comprise a heat engine, such as a piston engine, gas turbine or a Wankel engine, wherein flashovers at the bearings may cause the above-described problems.

The housing can be a separate drive housing enclosing merely the rotary drive machine, but it can also be a general housing, e.g. a part of a structure of the aircraft, such as the fuselage or wing or tail unit where the rotary drive machine can be accommodated.

SUMMARY OF THE DRAWINGS

Embodiments of the invention will now be described in more detail below with reference to the attached drawing, wherein it is shown by:

FIG. 1 is a schematic representation of an aircraft drive device;

FIG. 2 is a schematic representation of an aircraft drive device according to one embodiment of the invention;

FIG. 3a an enlarged view of a detail of FIG. 2, showing an overcurrent arrester device of the aircraft drive device according to one embodiment;

FIG. 3b a sectional view of a further embodiment of the overvoltage arrester device;

FIG. 4 a schematic representation of a further embodiment of the aircraft drive device.

DETAILED DESCRIPTION OF AN EMBODIMENT OF THE INVENTION

Figure 5:
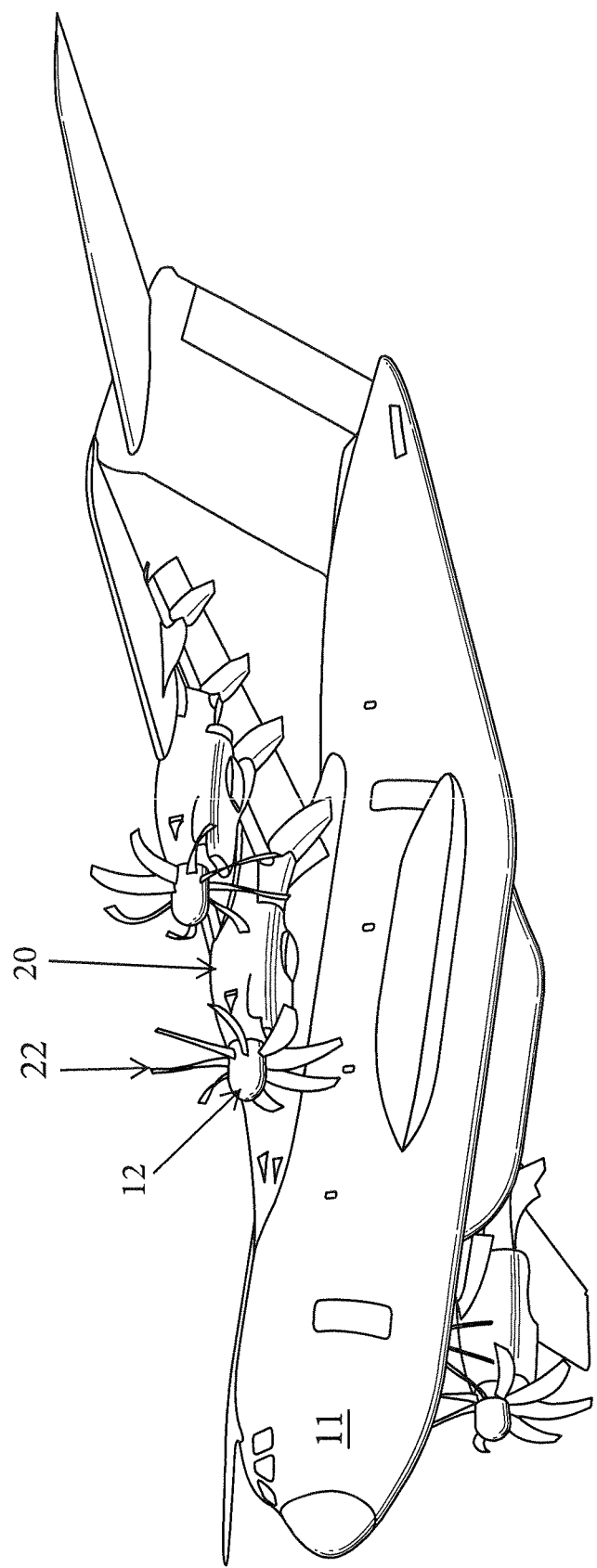
FIG. 5 illustrates an aircraft with an engine in a nacelle and a propeller.

FIGS. 1, 2, 3a and 3b are schematic representations of an aircraft drive device 10, 10' for creating propulsion and/or lift of an aircraft 11. FIG. 1 shows an aircraft drive device 10', and FIG. 5 shows an aircraft 11 having a propeller 22 driving by an aircraft drive device housed in a nacelle 20. FIG. 2 and FIG. 4 show different embodiments of an aircraft drive device 10 in accordance with the invention.

The aircraft drive device 10, 10' serves for creating propulsion and/or lift of an aircraft and comprises a rotating shaft 12 supported by a first rotating shaft bearing 14 and a second rotating shaft bearing 16, a rotating shaft drive machine 18 for rotationally driving the rotating shaft 12, and a housing 20, such as a nacelle. The housing (nacelle) is mounted to an aircraft, such as to a lifting surface, e.g., a wing, or to a fuselage of the aircraft.

On the rotating shaft 12, a propeller 22 is provided in particular, while a propeller in this case may also be understood to be a main rotor of a rotorcraft.

The housing 20 may also be part of an aircraft structure (such as the fuselage or wing) and may serve for realizing an aerodynamically advantageous design of the drive unit of the aircraft. The housing 20 is designed for providing a lightening protection for the rotating shaft drive machine 18. For this purpose, the housing especially creates a Faraday cage 24. To this end the housing 20 itself can be made of a conductive material, such as metal for example. In a particularly preferred form of construction, a shell of the housing 20 is formed of a composite material, such as CFRP (carbon-fiber-reinforced plastic), having embedded therein a (metallically) conductive layer or a conductive grid or a (metallically) conductive mesh or a tissue of a conductive material. Preferably, the housing 10 is provided on its surface with a coating, such as described and shown in DE 10 2006 046 002 A1 or DE 10 2011 112 518 A1.

In particular, the housing 20 with its Faraday cage 24 is at an electric housing potential 26; and correspondingly conductive regions or layers of the housing 20 are preferably electrically connected to the electrical ground of the aircraft.

The rotating shaft 12 can also be made of a metallically conductive material or of composite materials, in particular CFRP. Also the rotating shaft 12 is preferably provided with at least one conductive layer or an axially extending conductive web being at an electrical rotating shaft potential 28.

The rotating shaft drive machine 18 particularly comprises an electric machine 30 and more particularly an electric motor 32 having a stator 34 (shown in a cut-open view in the Figures) whose electric potential is also connected to the ground and thus is at the housing potential 26, and a rotor 36, wherein a rotor shaft of the rotor 36 is connected to or constitutes the rotating shaft 12.

The rotating shaft bearings 14, 16 serve for supporting the rotating shaft 12 and respectively comprise a stationary bearing element 38 and rotatable bearing element 40. The stationary bearing element 38 is connected in a stationary manner and can be at the housing potential 28 and/or grounded. The rotatable bearing element 40 is connected to the rotating shaft 12 and can be at the rotating shaft potential 28. The bearing elements 38, 40 can for instance be bearing shells with bearing rollers running between them.

Since the propeller 22 rotates in the outer space outside the housing 20, the rotating shaft 12 passes from the interior 44 of the housing 20 through a housing opening 42 to the exterior of the housing 20 and thus protrudes through this housing opening 42 to the outside. A propeller 22 is attached to the protruding end of the rotating shaft 12. For example, the rotating shaft 12 terminates towards the outside with a rotor nose (not further illustrated).

FIG. 1 shows an aircraft drive device 10' without the inventive measures. If a lightening 46 strikes the propeller 22 or the protruding end of the rotating shaft 12, even the rotor 36 of the electric machine 30 will be raised to the electric potential of the lightening 46 via the rotating shaft 12—rotor shaft. A dashed line in FIG. 1 and FIG. 2 shows the respective path of the current 48 in the case of a lightening strike. As the distance between the rotor 36 and the grounded stator 34 should be kept as small as possible in order to achieve a good magnetic coupling, flashovers may occur in this case as a result of the high voltage difference caused by the lightening 46 and may cause various damages, such as the destruction of the insulation of the winding, damages to magnetic material, damages to surfaces caused by melting etc. Additional flashovers 50 may occur between the bearing elements 38, 40 of the rotating shaft bearings 14, 16, particularly the first rotating shaft bearing 14 between the housing opening 42 and the electric machine 30. The flashovers 50 between the bearing elements 38, 40 may lead to a decomposition of a lubricant, to damages to the bearing races or to undesired material welding etc.

To avoid these problems, in the inventive aircraft drive device 10 according to FIG. 2 and FIG. 4, an overvoltage arrester device 52 is arranged in the region of the housing opening 42. The overvoltage arrester device 52 is designed for diverting an overvoltage present at the rotating shaft 12 from the rotating shaft potential 28 to the housing potential 26 and/or to ground.

Possible embodiments of the overvoltage arrester device 52 are shown in FIG. 3a and FIG. 3b.

The overvoltage arrester device 52 comprises a stationary element and a rotating element 12 rotating together with the rotating shaft 12, and the overvoltage is diverted between these two elements. This preferably takes place in a contactless manner by an electric arc. Because of their function, the elements of the overvoltage arrester device 52 are hereinafter referred to as electrode elements, wherein the overvoltage occurs between these electrode elements.

Accordingly, in an embodiment, the overvoltage arrester device 52 comprises a stationary electrode element 54, which is electrically connected to ground and/or to the housing potential 26. The overvoltage arrester device 52 further comprises a rotating electrode element 56 that is connected to the rotating shaft 12 and is electrically at the rotating shaft potential 28. In particular, the electrode elements 54, 56 comprise ring electrodes with facing electrode surfaces 60 that are spaced from each other by a gap 62, which is as small as possible. Preferably, the gap distance 64 between the electrode elements 54, 56 is so small that the smallest distance in the region of the electrode elements 54, 56 is created between the housing potential 26 and the rotating shaft potential 28.

In the embodiment shown in FIG. 3a, one of the electrode elements 56 is received between two regions of the other electrode element 54. For example, one of the electrode elements 54 comprises two ring electrodes 58 between which the ring electrode 58 of the other electrode element 56 is received.

In a concrete exemplary construction, an outer ring 66 and an inner ring 68 made of or provided with an electrically conductive material are provided on the housing opening 42, and a ring 70 attached to and radially spaced from the rotating shaft 12 engages between said outer ring and an inner ring.

As shown in FIG. 3b, the electrode elements 54, 56 may be provided with field-boosting structures 72 or field-boosting geometries. In particular, spikes of a conductive material may be provided (which can also be surrounded by a dielectric).

Even more particularly, in one of the configurations shown in DE 10 2006 046 002 A1 or DE 10 2011 112 518 A1, the field-boosting structure 72 is provided in a coating 78 of the electrode surface 60. The corresponding field-boosting structures 72 may be provided on the electrode surfaces 60 of the ring electrodes 58.

In the construction shown in FIG. 3b, a radially inner surface of a stationary ring 66, 68 surrounding the rotating shaft 12 with the small gap distance 64 of the gap 62 is provided with the field-boosting structure 72, and also the peripheral surface 80 of the rotating shaft 12 is provided with a field-boosting structure 72 in this region.

By corresponding measures, see FIG. 2, the overvoltage at the rotating shaft potential 28 caused by the lightening 46 at the time of the lightning strike is diverted to the housing 20 via the overvoltage arrester device 52 in the region of the entry of the rotating shaft 12 so that the inner structures of the aircraft drive device 12 are protected against overvoltage.

As a supporting measure, also the rotating shaft bearings 14, 16 are provided with an electrical insulation 82.

The transition of the overvoltage takes place by an electric arc 84 that should be maintained until the lightening energy has been diverted as far as possible.

For this reason, the overvoltage arrester device 52 is either protected from relative wind or wind produced by the propeller 22 by the stationary outer ring 66 as a wind deflector element 86 or by providing a separate wind deflector element 86 for deflecting wind 88 as in the further embodiment shown in FIG. 4.

The aircraft drive device 10 can be used for driving or propelling various aircrafts, such as airplanes, helicopters, rotorcrafts. For further details concerning the aircraft, reference is made to the embodiments described in DE 10 2005 006 511 A1, DE 10 2013 109 392 A1, DE 10 2019 021 024 B1, DE 10 2013 101 602 A1 and DE 10 2006 056 356 A1 showing further features for a possible design of the propeller/rotor and/or the aircraft drive device 10.

In an embodiment, the aircraft drive device 10 for producing propulsion and/or lift of an aircraft comprises a rotating shaft 12, a rotating shaft bearing 14, 16, a rotating shaft drive machine 18 for rotationally driving the driving shaft 12, and a housing 20, wherein the rotating shaft bearing 14, 16 and the rotating shaft drive machine 18 are arranged in the interior of the housing 44 and the rotating shaft 12 protrudes to the outside of the housing 20 through a housing opening 42, wherein in the region of said housing opening 42 an overvoltage arrester device 52 is arranged which is designed for diverting an overvoltage present at the rotating shaft 12.

The aircraft drive device 10 may have one or more of the following features:

(a) the rotating shaft drive machine 18 is an electric machine 30, in particular an electric motor 32 having a rotor 36 and a stator 34;

(b) an electrically driven propeller 22;

(c) a propeller 22 is arranged on the part of the rotating shaft 12 protruding from the housing 20;

(d) a first rotating shaft bearing 14 and a second rotating shaft bearing 16;

(e) the housing 20 is designed for creating a lightening protection for the rotating shaft drive machine 18 itself;

(f) the housing 20 creates a Faraday cage 24 and/or (g) at least a region of the rotating shaft 12 is at an electric rotating shaft potential 26 and at least a region of the housing 20 is at a housing potential 26, wherein the overvoltage arrester device 52 is designed for diverting the overvoltage from the rotating shaft potential 28 to the housing potential 26.

In the aircraft drive device 10 the overvoltage arrester device 52 may comprise a stationary electrode element 54 designed for diverting an overvoltage and a rotatable electrode element 56 being at rotating shaft potential 28, wherein the electrode elements 54, 56 are spaced by a gap 62, for a contact-free voltage transfer of overvoltage.

The overvoltage arrester device 52 in the aircraft drive device 10 may have one or more of the following features:

(a) at least one of the electrode elements 54, 56 is ring-shaped;

(b) at least one of the electrode elements 54, 56 comprises a first ring 66 and a second ring 68 between which the other electrode element 54, 56 is received;

(c the electrode elements 54, 56 may have substantially parallel opposing electrode surfaces 60 between which said gap 62 is formed;

(d) at least one of the electrode elements 54, 56 comprises an electric arc ignition element for igniting a plasma channel in the gap for the purpose of transferring the overvoltage;

(e) at least one of the electrode elements 54, 56 is provided with a tip 74 of a conductive material;

(f) at least one of the electrode elements 54, 56 is provided with a coating in which spikes 74 of conductive particles and/or polarizable particles are provided;

(g) the gap 62 represents the smallest distance between the rotating shaft potential 28 and the housing potential 26; and (h) the gap 62 has a gap distance 64 in the range of 0.1 μm to 10 mm, preferably in the range of 0.01 mm to 5 mm.

In the aircraft drive device 10, the rotating shaft bearing 14, 16 may comprise a stationary bearing element 38 and a rotatable bearing element 40 and an electric insulation 82 for electrically insulating said stationary bearing element 38 from said rotatable bearing element 40.

In the aircraft drive device 10, at least a region of the rotating shaft 12 and/or of the housing 20 is provided with a lightening protection coating 78.

In the aircraft drive device 10, the lightening protection coating 78 is chosen among one or more of a group of coatings 78 including a coating 78 with an electrically conductive layer, a coating 78 with an electrically conducting grid, a coating 78 with electrically polarizable particles, a coating 78 with electrically conductive particles provided with spikes 74, a coating 78 with electrically conductive particles in a dielectric matrix, a coating 78 with electrically conductive particles provided with spikes 74 in a dielectric matrix, and a coating 78 with electrical ignition elements for igniting an electric arc 84.

In the aircraft drive device 10, the overvoltage arrester device 52 may comprise a wind deflector device 86 for the protection of the electric arc 84.

In the aircraft drive device 10, the overvoltage arrester device 52 may be configured to in one or more of the following manners:

(a) enable the diversion of an overvoltage between the rotating rotary shaft 12 and stationary part;

(b) designed in such a way that the diversion of the overvoltage takes place in a contactless manner by flashover 50 and an electric arc 84;

(c) have a field-boosting geometry so that the flashover occurs at the intended location; and (d) provided with a field-boosting coating 78 so that the flashover preferably occurs at the intended location.

An aircraft may include the aircraft drive device 10.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE NUMBERS 10 aircraft drive device
10' aircraft drive device (not in accordance with the present invention)
11 aircraft
12 rotating shaft
14 first rotating shaft bearing
16 second rotating shaft bearing
18 rotating shaft drive machine
20 housing
22 propeller
24 Faraday cage
26 housing potential
28 rotating shaft potential
30 electric machine
32 electric motor
34 stator (shown cut-open)
36 rotor
38 stationary bearing element
40 rotatable bearing element
42 housing opening
44 interior of the housing
46 lightening
48 current path
50 flashover
52 overvoltage arrester device
54 stationary electrode element
56 rotating electrode element
58 ring electrodes
60 electrode surface
62 gap
64 gap distance
66 stationary outer ring
68 stationary inner ring
70 rotatable ring
72 field-boosting structure
74 spike
78 coating
80 peripheral surface
82 electric insulation
84 electric arc
86 wind deflector element
88 wind

The invention claimed is:

1. An aircraft drive device for producing propulsion and/or lift of an aircraft comprising:
   a rotating shaft,
   a rotating shaft bearing,
   a rotating shaft drive machine for rotationally driving the driving the rotating shaft, and
   a housing, wherein the rotating shaft bearing and the rotating shaft drive machine are arranged in an interior of the housing, and the rotating shaft protrudes outside of the housing through a housing opening, and
   an overvoltage arrester device is arranged in a region of the housing opening and is configured to divert an overvoltage present at the rotating shaft,
   wherein the overvoltage arrester device comprises:
      a stationary electrode element;
      a rotatable electrode element, and
      a gap separating the stationary electrode element from the rotatable electrode element such that the stationary electrode and rotatable electrode do not contact and the overvoltage flows across the gap between the stationary and the rotatable electrodes, wherein the gap provides a contact-free voltage transfer of the overvoltage through the overvoltage arrester, and spikes formed of conductive material on the stationary and rotatable electrodes are configured as field-boosting structures, wherein the spikes on the stationary rotatable electrode face the spikes on the rotatable electrode, wherein the spikes form an electric arc ignition element configured to ignite a plasma channel to divert the overvoltage across the gap, wherein the gap is a distance in a range of 0.1 µm to 10 mm, and wherein one of the stationary electrode element and the rotatable electrode element includes a first ring and a second ring and the other of the rotatable electrode element and the stationary electrode element extends through the first and second rings.

2. The aircraft drive device according to claim 1, wherein the rotating shaft drive machine is an electric motor having a rotor and a stator.

3. The aircraft device according to claim 1 wherein the aircraft drive device further comprises a propeller arranged on a portion of the rotating shaft protruding outside of the housing.

4. The aircraft device according to claim 1 wherein the rotating shaft bearing includes a first rotating shaft bearing and a second rotating shaft bearing.

5. The aircraft device according to claim 1 wherein the housing is configured as a Faraday cage to provide lightening protection for the rotating shaft drive machine.

6. The aircraft device according to claim 1 wherein at least a region of the rotating shaft is at an electric rotating shaft voltage potential and at least a region of the housing is at a housing voltage potential, wherein the overvoltage arrester device is configured to divert the overvoltage from the rotating shaft potential to the housing potential.

7. The aircraft drive device according to claim 1, wherein: the gap represents a smallest distance between the rotating shaft potential and the housing potential.

8. The aircraft drive device according to claim 1, wherein the rotating shaft bearing comprises a stationary bearing element and a rotatable bearing element, and an electric insulation configured to electrically insulate the stationary bearing element from the rotatable bearing element.

9. The aircraft drive device according to claim 1 wherein at least a region of the rotating shaft and/or of the housing is provided with a lightening protection coating, wherein the lightening protection coating is at least one of:
    a coating with an electrically conductive layer,
    a coating with an electrically conducting grid,
    a coating with electrically polarizable particles,
    a coating with electrically conductive particles provided with spikes,
    a coating with electrically conductive particles in a dielectric matrix,
    a coating with electrically conductive particles provided with spikes in a dielectric matrix, and
    a coating with electrical ignition elements for igniting an electric arc.

10. The aircraft drive device according claim 1 wherein the overvoltage arrester device comprises a wind deflector device configured to protection an electric arc.

11. The aircraft drive device according to claim 1 wherein the overvoltage arrester device is configured as at least one of:
    to enable the diversion of the overvoltage between the rotating rotary shaft and the stationary part;
    to divert the overvoltage in a contactless manner by flashover and an electric arc;
    to have a field-boosting geometry; and
    to have a field-boosting coating.

12. An aircraft comprising the aircraft drive device according claim 1.

13. The aircraft drive device according claim 1 wherein at least one of the conductive rotating electrode element and the conductive stationary electrode element includes an electric arc ignition element configured to ignite a plasma channel in the gap.

14. An aircraft drive device and nacelle assembly mounted to an aircraft, the assembly comprising:
    a nacelle configured to be mounted to an aircraft wing or fuselage, wherein the nacelle has a forward facing opening;
    an aircraft drive device housed in the nacelle;
    a shaft rotatably driven by the aircraft drive device, wherein the shaft extends forward of the aircraft drive device through the opening in the nacelle and outward of the nacelle;
    an overvoltage arrester device in the nacelle and including:
    a conductive rotating electrode conductively attached to and rotating with the shaft, wherein the conductive rotation electrode includes a first electrode surface with spikes;
    a conductive stationary electrode conductively attached to the aircraft, wherein the conductive rotating electrode is conductively attached to the shaft forward of the aircraft engine, and wherein the conductive rotating electrode includes a second electrode surface with spikes facing the spikes of the first electrode surface, wherein the spikes form an electric arc ignition element configured to ignite a plasma channel to divert the overvoltage across a gap, and
    the gap separates the conductive rotating electrode and the conductive stationary electrode element, wherein the gap is in a range of 0.1 µm to 10 mm,
    wherein the gap provides a contact-free voltage transfer of overvoltage through the overvoltage arrester, and
    wherein one of the conductive rotating electrode and the conductive stationary electrode includes rings and the other of the conductive stationary electrode and the rotating electrode extends through the rings.

15. The aircraft drive device and nacelle assembly of claim 14 wherein the overvoltage arrester device is proximate the opening in the nacelle.

16. The aircraft drive device and nacelle assembly of claim 14 wherein the conductive rotating electrode includes the rings and the rings include a first ring electrode centered on the shaft.

17. The aircraft drive device and nacelle assembly of claim 16 wherein each of the coatings includes at least one of:
    an electrically conductive layer,
    an electrically conducting grid,
    electrically polarizable particles,
    electrically conductive particles provided with spikes,
    electrically conductive particles in a dielectric matrix,
    electrically conductive particles provided with spikes in a dielectric matrix, and electrical ignition elements configured to ignite an electric arc in the gap.

18. A method to divert electricity from a lighting strike away from an aircraft drive device, the method comprising:

driving a shaft by an aircraft drive device, wherein the aircraft drive device is housed in a nacelle of an aircraft and the shaft extends forward of an opening in the nacelle;

conducting electricity from a lighting strike on the shaft or on a propeller mounted to the shaft along the shaft to an overvoltage arrester device mounted to the shaft forward of the aircraft drive device, wherein the overvoltage arrester device includes a conductive rotating electrode with conductive first spikes mounted to the shaft and a conductive stationary electrode with conductive second spikes facing the first spikes and the conductive stationary electrode is mounted to and conductively coupled to the aircraft, and wherein one of the conductive rotating electrode and the conductive stationary electrode includes at least two rings and the other of the conductive stationary electrode and the conductive rotating electrode extends through the at least two rings;

the conducted electricity flashes over a gap between the first spikes of the conductive rotating electrode and the second spikes of the conductive stationary electrode to allow the conducted electricity to flow from the conductive rotating electrode to the conductive stationary electrode, wherein the gap provides a contact-free voltage transfer of the conducted electricity through the overvoltage arrester and the first and/or second spikes form an electric arc ignition element configured to ignite a plasma channel as the conducted electricity flashes over the gap, and, wherein the gap is a distance in a range of 0.1 µm to 10 mm, and diverting the conducted electricity away from the aircraft drive device by the flashover of the conducted electricity to the conductive stationary electrode.

19. The method of claim 18 further comprising using the gap to electrically isolate the conductive rotating electrode from the conductive stationary electrode, wherein the lighting strike and the flashover overcomes the isolation.

* * * * *